US006854076B2

United States Patent
Burt et al.

(10) Patent No.: US 6,854,076 B2
(45) Date of Patent: Feb. 8, 2005

(54) METHOD AND APPARATUS FOR CALIBRATION OF AN ELECTRONIC DEVICE

(75) Inventors: Rodney T. Burt, Tucson, AZ (US); R. Mark Stitt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 605 days.

(21) Appl. No.: 09/826,405

(22) Filed: Apr. 3, 2001

(65) Prior Publication Data

US 2002/0163381 A1 Nov. 7, 2002

(51) Int. Cl.[7] .............................................. G11B 5/00
(52) U.S. Cl. ...................................................... 714/700
(58) Field of Search .......................................... 714/700

(56) References Cited

U.S. PATENT DOCUMENTS

| 4,086,541 A | 4/1978 | Katou et al. ................. 330/51 |
|---|---|---|
| 5,424,677 A | 6/1995 | Carson ........................... 330/2 |
| 5,477,504 A | 12/1995 | Hagerty ......................... 367/13 |
| 6,069,533 A | 5/2000 | Kim ............................. 339/258 |

*Primary Examiner*—Albert DeCady
*Assistant Examiner*—Esaw Abraham
(74) *Attorney, Agent, or Firm*—W. Daniel Swayze, Jr.; W. James Brady; Frederick J. Telecky, Jr.

(57) ABSTRACT

A method and apparatus for auto-calibrating an electronic device without interrupting normal operation of the device. An electronic device configured as a high voltage difference amplifier is disclosed having a calibration circuit which couples a calibration excitation signal to a common-mode signal path of the difference amplifier. The difference amplifier includes a variable transfer function circuit which may be used to adjust the common-mode rejection of the difference amplifier. The calibration excitation signal may be a random, pseudo-random, out-of-band, or other frequency shaped signal generated in reference to a clock signal. A calibration error signal is detected from an output signal. The variable transfer function circuit can be adjusted in response to the detected error signal to reduce the calibration error signal. As a result, common-mode rejection errors of the difference amplifier may be reduced while the difference amplifier is coupled to an input signal source.

35 Claims, 3 Drawing Sheets

METHOD AND APPARATUS FOR CALIBRATION OF AN ELECTRONIC DEVICE

BACKGROUND OF THE INVENTION

1. Field of the Invention

The present invention relates generally to calibration of electronic devices. More particularly, the present invention relates to calibration of amplifiers by modifying the transfer function associated with a variable transfer function, and most usefully to high voltage difference amplifiers with unmatched external input resistors. Embodiments of the invention include circuitry which periodically or continuously auto-calibrates an electronic device by adjusting variable transfer function circuitry of the electronic device while the electronic device is receiving an operating signal.

2. State of the Art

Signal quality is a common concern among designers and manufacturers of precision electronic signal conditioning devices. Unfortunately, however, variations in production processes, environmental variations, such as temperature, package assembly stress, and the like, and variations caused by differences in component aging, can make it difficult to achieve high signal conditioning accuracy. Difference amplifiers, for example, are designed to cancel a common-mode signal at their inputs and pass only the differential signal between the two input signal lines. The ability to cancel the common-mode input signal is called common-mode rejection. A precision difference amplifier can be made with an op amp and four precision resistors. Its ability to cancel the common-mode signal depends on resistor matching. When certain resistors have insufficient matching accuracy, signals which are common to both input signal lines may appear to be differential signals. Components which are selected with very tight tolerances, sufficient to provide high common-mode rejection, can be relatively expensive compared to standard components.

To overcome the need to use expensive specialized components in electronic devices, various calibration procedures are commonly used to compensate for component variations. Conventional calibration can be performed in a number of different ways and at various times during the manufacture or use of a product. Typically, calibration may be performed at a production factory prior to incorporating the electronic device into larger electronic systems. Factory calibration, however, can be expensive and, without periodic or semi-continuous calibration, the electronic devices are subject to drift due to environmental and other factors. For periodic or semi-continuous calibration, there is a need for input switches and control circuitry to isolate the input signal during the calibration adjustment phase. Examples of calibration procedures using isolation switches are shown and described in U.S. Pat. No. 4,086,541 to Katou et al. (Apr. 25, 1978) and U.S. Pat. No. 5,424,677 to Carson (Jun. 13, 1995). The switches required to isolate high input voltages in particular, such as those required for high voltage difference amplifiers, can be particularly expensive to implement. Traditional low voltage integrated circuit processes do not include high voltage switches. Circuits built on high voltage processes typically cost more than that of comparable circuits built on low-voltage processes due to the larger size required for high voltage components.

Calibration is conventionally incorporated into an initialization phase of an electronic device such as that disclosed in U.S. Pat. No. 6,069,533 to Kim (May 30, 2000). Kim discloses providing a DC signal of a predetermined value to two input terminals of an electronic circuit for an audio/video system during the initial 'power-on' sequence of the system. A feedback loop from the output of a signal mixing stage of the circuit provides input to a microprocessor which controls a single electronic variable resistor which adjusts the resistance between both the inverting and non-inverting inputs of a difference amplifier and ground. This form of non-periodic calibration, however, because it is only designed to calibrate during the initial 'power-on' sequence, presumes that the calibration parameters remain unchanged after initialization. Signal treatment by electronic components can change as the temperature changes. As an electronic device warms-up or as the ambient temperature changes, the initial calibration may be insufficient to provide the desired long term precision.

SUMMARY OF THE INVENTION

It is an object of the invention to provide a calibration circuit which calibrates an electronic circuit during normal operation of the electronic circuit.

It is another object of the invention to provide a calibration circuit which does not require isolation of the inputs to calibrate the electronic circuit.

It is yet another object of the invention to provide a self-calibrating difference amplifier configured for periodic or continuous calibration.

It is an object of the invention to provide a self-calibrating high voltage difference amplifier which does not require isolation of the high voltage input signals for calibration.

It is an object of the invention to provide a auto-calibrating electronic device which uses a random, pseudo-random or out of band calibration excitation signal to calibrate the electronic device without suspending normal operation of the device.

It is an object of the invention to provide a relatively low cost auto-calibrating circuit for a high voltage difference amplifier.

The present invention provides a method and apparatus for calibrating an electronic device during normal operation of the device. The apparatus includes a calibration circuit either integral with or distinct from an electronic device, the calibration circuit having a calibration excitation signal generator which applies a calibration excitation signal to the electronic device so as to cause a synchronous error signal to be superimposed on the output signal produced by the electronic device. Calibration error signal detector circuitry, synchronous with the calibration excitation signal, detects a superimposed calibration error signal component in the output signal of the electronic device. Calibration control circuitry then adjusts circuitry characterized by a variable transfer function of the electronic device to calibrate the electronic device in accordance with the detected calibration error signal. This calibration is configured to minimize or eliminate errors caused by certain inaccurate component values associated with the electronic device.

In one particular embodiment, the electronic device is a high voltage difference amplifier having the inverting and non-inverting inputs of an instrumentation amplifier coupled to unmatched resistors. As used herein, the term "high voltage difference amplifier" is intended to include difference amplifiers with input operating voltages greater than the power supply voltage of the difference amplifier. The calibration circuit in this embodiment is integral with the high voltage difference amplifier and is configured to continuously calibrate the errors resulting from the common mode voltage at the inputs to the high voltage difference amplifier. The circuitry characterized by a variable transfer function includes a differential resistor divider coupled to each of the inverting and non-inverting inputs to the instrumentation amplifier. A calibration excitation signal is generated in response to a clock signal and is conducted to the inputs of the instrumentation amplifier through the differential resistor divider. By using an out-of-band or frequency spectrum-shaped signal generator to produce the calibration clock, and hence the calibration excitation signal, the calibration error signal may be distinguished from a normal operating signal and detected in the amplifier output signal. By adjusting a differential resistor divider in response to an evaluation of the error signal, the error due to the common mode voltage signal at the inputs of the device may be effectively eliminated without the need to disconnect the normal operating signal or inputs from the high voltage difference amplifier and without regard to the presence of an input signal.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the drawings herein, wherein:

DETAILED DESCRIPTION OF THE INVENTION

Figure 1:
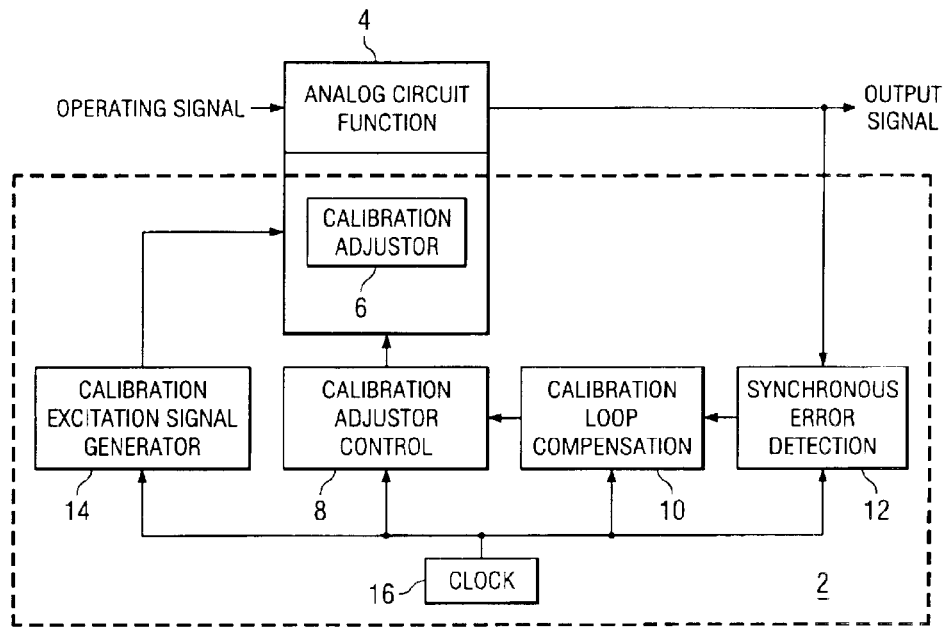
FIG. 1 is a block diagram of a calibration circuit coupled to an electronic circuit according to an embodiment of the present invention.

FIG. 1 includes a block diagram of a calibration circuit 2, according to an embodiment of the present invention, for auto-calibrating the signal characteristics of an electronic device such as an analog circuit function 4. The signal characteristics which may need to be calibrated are well known in the art and include such characteristics as common mode error. The calibration circuit 2 may be formed integrally with the analog circuit function 4, such as on the same circuit chip, circuit board, or within the same enclosure, or may alternatively be formed in a separate enclosure, on a separate chip or circuit board, or as an additional circuit. Prior art calibration circuitry requires the ability to disconnect or otherwise isolate the input signal during a calibration cycle of a high voltage electronic device. However, in the approach used in embodiments of the present invention, the calibration circuitry may calibrate even a high voltage electronic device without isolating the inputs or suspending or interrupting normal operation of the device.

The calibration circuit 2 includes a calibration adjustor circuit 6 responsive to a calibration adjustor control 8. The calibration adjustor control 8 receives a signal from a calibration loop compensation circuit 10 which generates a signal in response to an evaluation of an output from a synchronous error detection circuit 12. A calibration excitation signal generator 14 generates a calibration excitation signal at a rate determined by a calibration clock circuit 16.

In accordance with embodiments of the present invention, the calibration excitation signal is applied to the analog circuit function 4 without interrupting the normal operation of the analog circuit function 4. As used herein, "normal operation" means operation of the analog circuit in the purpose for which it was designed without regard to whether the inputs to the analog circuit have been calibrated or not, or whether any operating signal is presently being received by the analog circuit. During normal operation of the analog circuit function 4, an operating signal may be received and transmitted through the analog circuit function. The effects of the operating signal may be observed at the output of the analog circuit function 4 in the form of an output signal. During a calibration cycle of the analog circuit function 4, a calibration excitation signal is input into the analog circuit with the operating signal and is similarly amplified by or otherwise operated on by the analog circuit function 4. As a result, synchronous with the calibration excitation signal, an error signal is superimposed on the normal output signal produced by the analog circuit function in response to the calibration excitation signal. The effects of the combined operating signal and calibration excitation signal may be observed in the form of an output signal at the output of the analog circuit function 4 as follows:

Output Signal=Output Operating Signal+Operating Error Signal+ Calibration Error Signal In accordance with embodiments of the present invention, because the operating error signal and the calibration error signal are caused by the same miscalibrations and component inaccuracies, adjusting the calibration adjustor circuit to eliminate the superimposed calibration error signal caused by the calibration excitation signal will also eliminate the operating error signal.

During a calibration cycle for the analog circuit function 4, the synchronous error detection circuit 12 synchronously samples the output signal, detects or extracts the superimposed calibration error signal and produces an error detection signal for evaluation by the calibration loop compensation circuit 10. The calibration loop compensation circuit 10 then sends an appropriate feedback signal representative of the superimposed calibration error signal to the calibration adjustor control 8 for adjusting the calibration adjustor circuit 6 to calibrate the analog circuit function 4 so as to minimize or eliminate the superimposed calibration error signal. The calibration adjustor circuit 6 includes at least one circuit element characterized by a variable transfer function for calibrating the analog circuit function 4. Some examples of circuit elements which are characterized by a variable transfer function include a variable current source, a variable current mirror and a variable impedance such as a variable resistor or a variable capacitor. Each of the individual sub-circuits 6, 8, 10, 12 and 14 in the calibration circuit 2 operate at a rate determined by the calibration clock circuit 16. The calibration loop compensation circuitry 10 may be implemented with analog or digital filter techniques, or a combination of both.

The relationship between the clock signal and the high voltage difference amplifier input signal, or operating signal, is important. For a fixed clock frequency, the magnitude of the operating signal must be sufficiently low at frequencies approaching the clock frequency to not interfere with the calibration error signal (i.e. aliasing). For situations where the operating signal may interfere with the calibration excitation signal, a random or pseudo-random frequency clock or other known signal spectrum shaping techniques may be used in combination with the calibration loop compensation circuitry 10 to achieve the desired accuracy of calibration. This technique spreads the power of any aliased signal over a wide frequency range where most of it is filtered by the calibration loop compensation circuitry 10, thus achieving the desired calibration accuracy in the presence of the operating signal.

Figure 2:
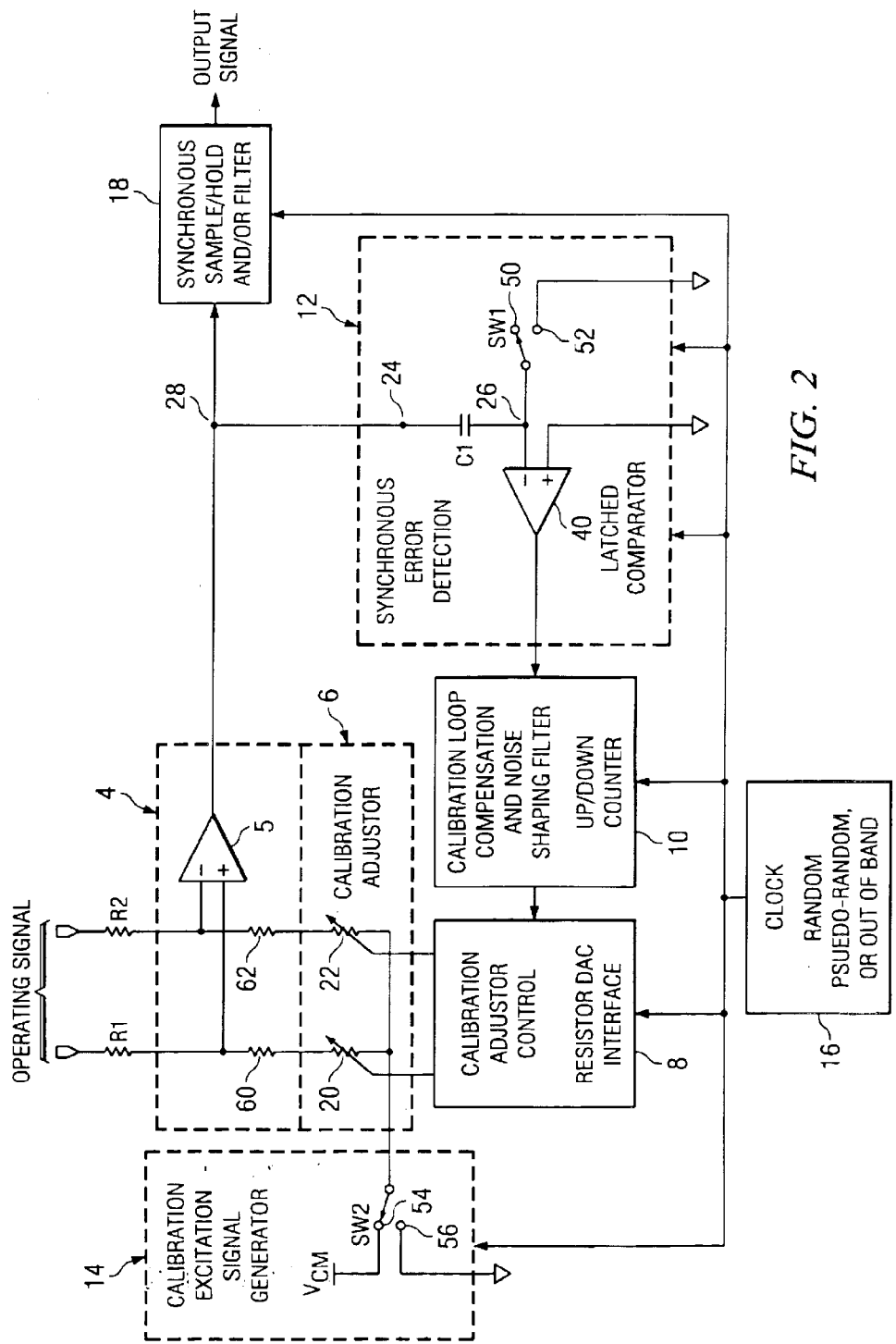
FIG. 2 is a diagram of a auto-calibrating circuit according to one specific embodiment of the present invention.

FIG. 2 illustrates one specific embodiment of the auto-calibration circuit shown in FIG. 1 configured as a high voltage difference amplifier using unmatched external resistors R1 and R2. The analog circuit function block 4 comprises an instrumentation amplifier 5 to provide gain and remove the common mode signal from the differential resistor divider comprising the unmatched external resistors R1 and R2 and the low voltage elements 20, 22, 60 and 62. The instrumentation amplifier shown in FIG. 2 is any circuit configuration that amplifies the differential signal at its inputs but rejects the common mode signal at its inputs. External fixed resistors R1 and R2 are the high voltage elements of the differential resistor divider and may be fabricated using low cost external elements. By providing resistors R1 and R2 off-chip, a low cost, low voltage integrated circuit process may be used for the high voltage difference amplifier. To achieve high direct current (DC) common mode rejection (CMR), the resistor ratios in the differential resistor divider should match closely (i.e. up to 0.001% for 100 dB common mode rejection).

The calibration excitation signal generator 14 produces a calibration excitation signal by operating a switch SW2 synchronously with switch SW1 in response to a calibration clock circuit 16. The switch embodiment shown in FIG. 2 is a general example of a type of circuitry which may be used to generate the calibration excitation signal. Any excitation signal generated by other circuitry could also operate equivalently to the switch SW2 shown here. On transitions of the calibration clock signal, the switch SW2 toggles the low voltage end of the differential resistor divider between a reference voltage node 54, such as Vcm, and another reference voltage node 56, such as ground, to generate the calibration excitation signal. The same calibration excitation signal is fed into each of the variable resistors 20 and 22, and the amplified difference between the inputs to the instrumentation amplifier 5 is observed at output node 28 of the difference amplifier 4. At output node 28, for part of every clock cycle, the output signal is caused by the normal operating differential input signal, common mode signal, and the calibration excitation signal when the switch SW2 is coupled to the reference voltage node 56. For another part of each clock cycle, the output signal is caused by the normal operating differential input signal, the common mode signal and the calibration excitation signal when the switch SW2 is coupled to the reference voltage node 54. The output of the difference amplifier 4 may also optionally include a synchronous sample/hold circuit, or analog filter circuit 18, to remove any residual high frequency glitches created by the calibration excitation signal in the case of continuous calibration.

External low cost elements may have typical tolerances of 1%. Therefore, internal variable resistors 20 and 22 are used for adjustment of the common mode rejection of the difference amplifier 4.

Figure 3:
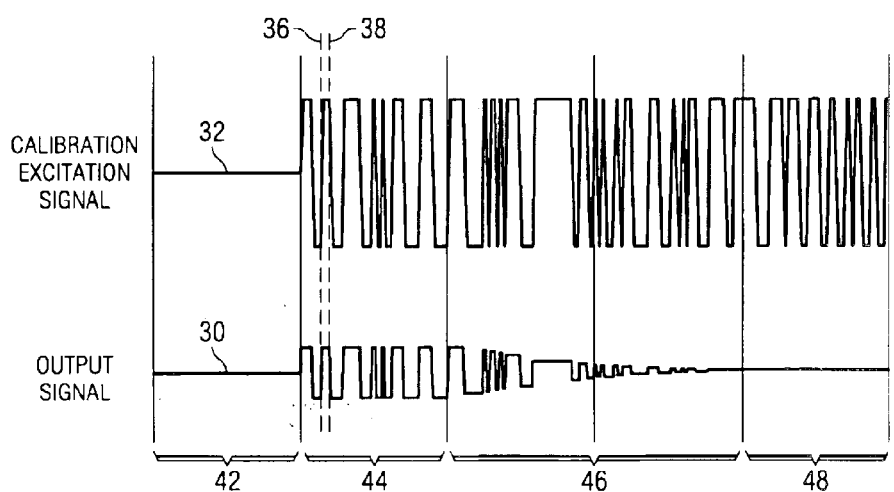
FIG. 3 is a timing diagram illustrating an amplifier output signal.

With reference to both FIGS. 2 and 3, during a calibration cycle of the difference amplifier, the synchronous error detector circuit 12 detects the portions of the error signal due to the calibration excitation signal from the output signal 30 at node 28. It does this by storing on capacitor C1 the difference between the voltages at the output node 28 when the calibration excitation signal 32 is low and when it is high. For exemplary purposes, the output signal 30 at node 28 has been divided into four individually numbered portions as follows: 42—Output Signal before calibration is turned on; 44—Output Signal after calibration excitation signal is turned on; 46—Output Signal during calibration; and 48—Output Signal after calibration. As can be seen in FIG. 3, when the calibration excitation signal 32 is changing at a higher rate than the operating signal or is shaped by a frequency spectrum shaping technique, the calibration error signal 32 may be readily observed in the output signal 30 at node 28.

When the calibration excitation signal 32 is low, such as at time 36, the switch SW1 of the synchronous error detector 12, which is operated by the calibration clock circuit 16, switches to ground. With the switch SW1 coupled to ground, the voltage on the first terminal 26 of capacitor C1 is at ground, and the voltage on the second terminal 24 of capacitor C1 is at the value of the operating voltage $V_O$ of the output signal at output node 28. Then, when the calibration excitation signal 32 goes high, such as at time 38, the prior value of the operating voltage $V_O$ of the output signal 30 at output node 28 remains stored on capacitor C1 because the switch SW1, and the first terminal 26 of capacitor C1 coupled to it, becomes coupled to the open terminal 50. The output signal 30 at output node 28 then changes to a new voltage $V_1$ that, in response to the calibration excitation signal 32, includes the operating output voltage and the superimposed error component caused by the calibration excitation signal 32 when it is high. When the output signal 30 at output node 28 changes to the new voltage $V_1$, the voltage at the first terminal 26 of capacitor C1 becomes equal to the difference between the new voltage $V_1$ at node 28 and the voltage $V_O$ stored on capacitor C1. The latched comparator 40 converts this difference voltage or error voltage to a digital "1" or "0", depending on whether the error voltage applied to the (−) input of latched comparator 40 is positive or negative, and applies the resulting stream of digital "1"s and "0"s to the calibration loop compensation circuit 10 as a digital error detection signal. In this way, the error detection signal, indicating positive or negative calibration error, is generated and transferred to the calibration loop compensation circuit 10.

In the embodiment shown in FIG. 2, the calibration loop compensation circuit 10 includes an up/down counter which steps up or down in response to the polarity of the latched comparator 40 output signal. The preferred up/down counter for the calibration loop compensation circuit 10 forms a digital integrator function. A digital integrator is a first order filter and, therefore, effectively filters and compensates the feedback loop created by the calibration circuit. The calibration control circuit 8 adjusts the variable resistors 20 and 22 to adjust the overall calibration of the system. When the calibration error signal goes to zero, the system becomes calibrated, and further adjustments are made only as needed to maintain calibration.

For the embodiment of the circuit shown in FIG. 2, the calibration clock circuit 16 may operate at a higher frequency than the normal operating signal. By operating at a much higher frequency, the calibration excitation signal components can be detected and filtered by the calibration loop compensation circuitry 10, to achieve the desired calibration accuracy in the presence of the operating signal. Alternatively, the calibration excitation signal may operate in the same frequency range as the normal operating signal if precautions are taken to reduce interference between the normal operating signal and the calibration excitation signal. In these cases, a random, pseudo-random frequency clock, or other known signal spectrum shaping technique may be used in combination with the calibration loop compensation circuitry 10 to spread the power of the calibration excitation signal components over a wide frequency range to achieve the desired accuracy of calibration.

Figure 4:
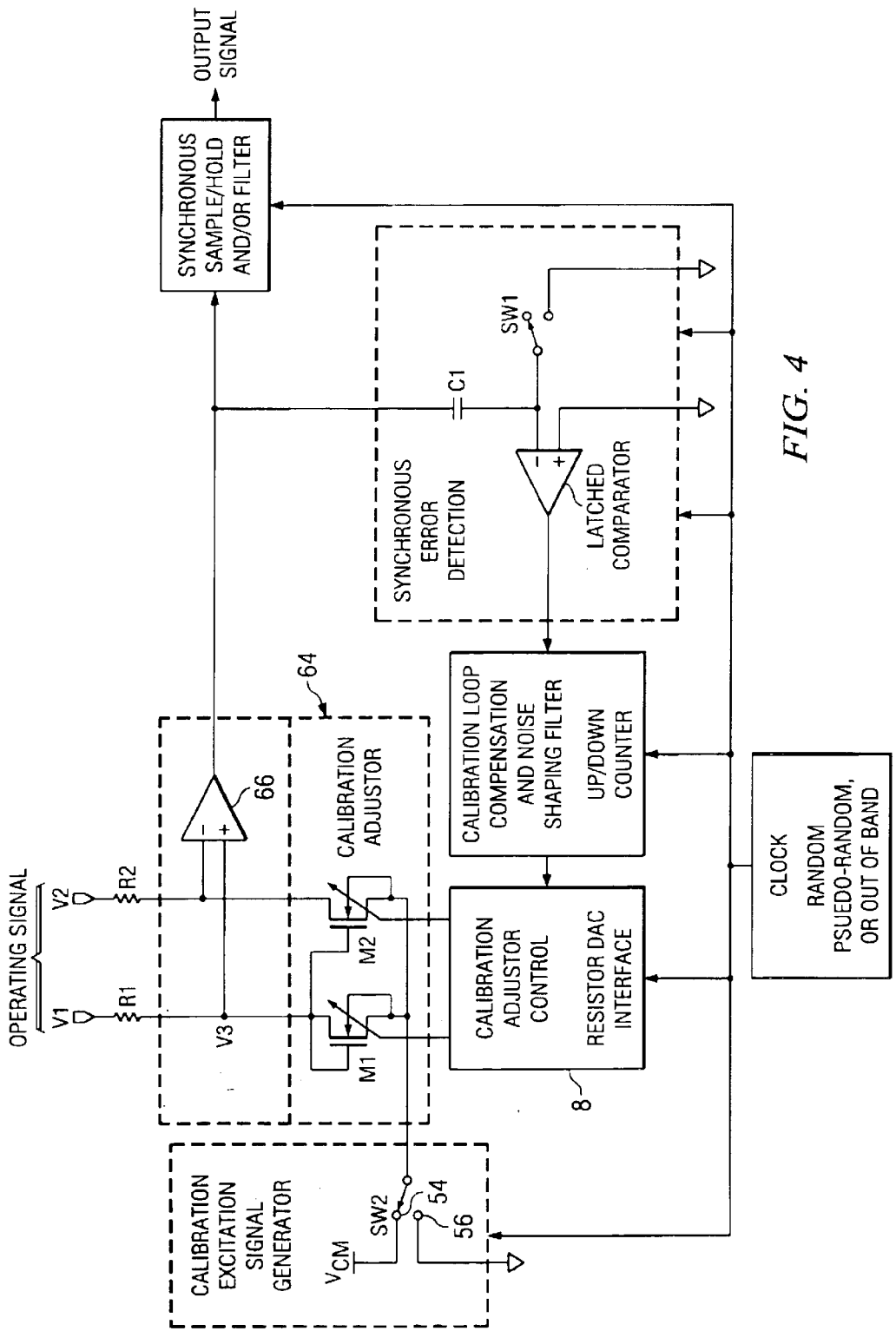
FIG. 4 is a diagram of a auto-calibrating circuit according to another specific embodiment of the present invention.

As will be clear to one of ordinary skill in the art, the invention described herein may be accomplished with various other circuitry without departing from the principles and scope of the invention. For example, as shown in FIG. 4, the variable resistors 20 and 22 and the fixed resistors 60 and 62 of the embodiment shown in FIG. 2 are replaced with a current mirror formed from n-channel MOS devices M1 and M2. The MOS devices may be formed as two single MOS devices, or as described hereafter, as two groups of MOS devices coupled in parallel. One practical implementation of the current mirror shown in FIG. 4 comprises two groups of MOSFETs respectively represented by M1 and M2. The MOSFETs in each respective group of MOSFETs may be configured with their drain electrodes coupled to the drain electrodes of the other MOSFETs in that respective group, their source electrodes coupled to the source electrodes of the other MOSFETs in that respective group, and their gate electrode connections controlled by the calibration control circuit 8. In this configuration, the gates of the MOSFETs are turned off an on in response to the calibration control circuit 8. By individually turning the gates of selected MOSFETs off and on, the calibration control circuit 8 can modify the composite W/L ratio of each group of MOSFETs, thereby adjusting transfer function of the current mirror. When the gate of a particular MOSFET is turned off, that MOSFET, and its associated W/L ratio, is no longer part of the group. When the MOSFET is turned on, it again becomes part of the group.

Operation of the calibration adjustor circuit 64 shown in FIG. 4 is similar to that of FIG. 2. The input signal at the non-inverting input of the difference amplifier is converted to a current by external fixed resistor R1 and flows through M1. This current is mirrored through M2 and flows through external fixed resistor R2. The ratio of the current mirror can be adjusted by changing the W/L ratios of M1 and M2. The differential input voltage to the instrumentation amplifier 66 can be represented by the following equation:

$$V_{diff} = V3*\left(1 - \frac{M_{ratio}*R_2}{R_1}\right) - V2 + V1*\left(\frac{M_{ratio}*R_2}{R_1}\right)$$

$V_{diff}$ is the differential input voltage to instrumentation amplifier 66. V1 and V2 are voltages at the inputs of the difference amplifier. Specifically, V1 is the voltage at the top of R1 and V2 is the voltage at the top of R2. V3 is the voltage at the positive input of instrumentation amplifier 66. V3 changes in response to the calibration excitation signal. $M_{ratio}$ is the current mirror ratio.

As indicated by this equation, adjustments in the W/L ratios of composite transistors M1 or M2 can calibrate for mismatches in R1 and R2 by adjusting the current mirror ratio so that $M_{ratio}*R2/R1=1$. When properly calibrated, the differential input voltage to the instrumentation amplifier from the calibration excitation signal and difference amplifier common-mode input can be reduced to provide high difference amplifier common-mode rejection. Other mirroring arrangements known in the art may also be used.

Another specific example of the calibration adjustor circuitry characterized by a variable transfer function is a pair of variable impedances or other circuitry having a variable transfer function. As will be clear to those of ordinary skill in the art, the variable transfer function elements, for example the variable resistors, may be implemented as two individually variable transfer function elements (i.e. two 1 KΩ to 10 KΩ variable resistors with a midrange of 5 KΩ), or may equivalently be implemented as one fixed transfer function element and one variable transfer function element (i.e. one 10 KΩ fixed resistor and one 20 KΩ variable resistor).

It should also be noted that the variable resistors shown, for example in FIG. 2, may equivalently be implemented as a group of resistors having multiple inputs to selectively switch associated sets of resistors into or out of parallel or serial or combined parallel-serial connection to vary the value of the resistive elements. Alternatively, the variable transfer function element could be equivalently implemented as a MOSFET operating in the triode region and controlled through an analog input at its gate. Those of ordinary skill in the art will understand that there are numerous possible variations known in the art for implementing a variable transfer function element circuit.

By enabling calibration without interrupting the normal operation of an electronic device, the invention is particularly useful for high voltage difference amplifiers and other applications which conventionally require that the inputs be disconnected prior to calibration. As will be clear to those of ordinary skill in the art, the calibration circuitry described herein may be implemented to automatically calibrate an electronic device periodically, continuously, in response to associated error detection circuitry, or upon user command. Because there is no need to disconnect the inputs or interrupt normal operation, a calibration cycle may be initiated at any time, even when used with a very high voltage input signal applied to the electronic device.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A calibration circuit for calibrating an electronic device while the input of the electronic device is coupled to a signal source, the calibration circuit comprising:
    a calibration excitation signal generator configured to generate a calibration excitation signal coupled to a signal path of the electronic device;
    a calibration error signal detector configured to receive an error signal from the signal path of the electronic device while the signal path of the electronic device is coupled to a normal operating signal source; and
    a variable transfer function circuit element in the signal path, the variable circuit element having a transfer function which is variable in response to a signal from the calibration error signal detector.

2. The calibration circuit of claim 1, wherein the variable transfer function circuit element comprises at least one of a variable resistor, a variable capacitor, and a variable current mirror.

3. The calibration circuit of claim 1, wherein the calibration excitation signal generator is configured to generate a signal at an out-of-band frequency.

4. The calibration circuit of claim 3, wherein the calibration excitation signal generator further comprises a switch configured to toggle between first and second reference voltages in response to a clock signal.

5. The calibration circuit of claim 1, wherein the calibration excitation signal generator is configured to generate a calibration excitation signal having a shaped frequency spectrum.

6. The calibration circuit of claim 5, wherein the shaped frequency spectrum is one of random and pseudo random shaping.

7. The calibration circuit of claim 1, wherein the calibration error signal detector comprises a synchronous error detector.

8. The calibration circuit of claim 7, wherein the synchronous error detector comprises:
- a latched comparator having first and second inputs and an output;
- a capacitor having a first terminal coupled to the first input of the latched comparator and a second terminal for coupling to the output of the electronic device; and
- a switch coupled to the first terminal of the capacitor for selectively switching the first terminal of the capacitor to a reference voltage.

9. The calibration circuit of claim 7, wherein the calibration error signal detector further comprises a calibration loop filter coupled between an output of the synchronous error detector and an input of the variable transfer function circuit element.

10. The calibration circuit of claim 9, wherein the calibration loop compensation comprises an up/down counter.

11. The calibration circuit of claim 1, wherein at least one of the calibration error signal detector and the calibration excitation signal generator is configured to operate in accordance with one of a random clock signal, a pseudo-random clock signal, an out-of-band clock signal and a frequency spectrum shaped signal.

12. The calibration circuit of claim 1, wherein the electronic device is configured as a difference amplifier.

13. An electronic circuit having a signal path coupled to receive an operating signal, the electronic circuit producing an output in response to the operating signal, the electronic circuit comprising:
- a calibration excitation signal generator configured to generate a calibration excitation signal;
- a variable transfer function circuit element coupled between the calibration excitation signal generator and the signal path of the electronic circuit, the electronic circuit producing on its signal path a calibration error signal superimposed on the operating signal in response to the calibration excitation signal;
- a calibration error signal detector coupled to the signal path of the electronic circuit for detecting the calibration error signal during normal operation of the electronic circuit; and
- a filter circuit coupled between the calibration error signal detector and the variable transfer function circuit element, wherein the filter circuit is configured to generate an adjustment signal operative to adjust the transfer function of the variable transfer function element circuit to minimize the calibration error signal.

14. The electronic circuit of claim 13, wherein the electronic circuit is configured as a difference amplifier.

15. The electronic circuit of claim 14, wherein the electronic circuit is configured as a high voltage difference amplifier.

16. The electronic circuit of claim 13, wherein the variable transfer function circuit element comprises at least one of a variable resistor, a variable capacitor and a variable current mirror.

17. The electronic circuit of claim 13, wherein the calibration excitation signal generator is configured to generate a signal at an out-of-band frequency.

18. The electronic circuit of claim 17, wherein the calibration excitation signal generator further comprises a switch configured to toggle between first and second reference voltages in response to a clock signal.

19. The electronic circuit of claim 13, wherein the calibration excitation signal generator is configured to generate a calibration excitation signal having a shaped frequency spectrum.

20. The electronic circuit of claim 19, wherein the shaped frequency spectrum is one of random and pseudo random shaping.

21. The electronic circuit of claim 13, wherein the calibration error signal detector comprises a synchronous error detector.

22. The electronic circuit of claim 21, wherein the synchronous error detector comprises:
- a latched comparator having first and second inputs and an output;
- a capacitor having a first terminal coupled to the input of the latched comparator and a second terminal coupled to the output of the electronic circuit; and
- a switch coupled to the first terminal of the capacitor for selectively switching the first terminal of the capacitor to a reference voltage.

23. The electronic circuit of claim 21, wherein the calibration error signal detector further comprises a calibration loop compensation and signal shaping filter coupled between an output of the synchronous error detector and an input of the variable transfer function circuit element.

24. The electronic circuit of claim 23, wherein the calibration loop compensation and signal shaping filter comprises an up/down counter.

25. The electronic circuit of claim 13, wherein at least one of the calibration error signal detector and the filter circuit is configured to operate in accordance with one of a random clock signal, a pseudo-random clock signal, an out-of-band clock signal and a frequency spectrum shaped signal generator.

26. The electronic circuit of claim 13, wherein the variable transfer function circuit element comprises at least one group of fixed resistors which may be selectively switched into and out of one of parallel, series, and combined parallel-series connection with each other to vary the transfer function of the element.

27. The electronic circuit of claim 13, wherein the electronic circuit comprises an analog circuit function.

28. The electronic circuit of claim 13, wherein the electronic circuit comprises a high voltage difference amplifier, the electronic circuit further comprising a pair of external resistors respectively coupled to first and second inputs of the electronic circuit to configure it as a high voltage difference amplifier.

29. A method of calibrating an electronic circuit, the method comprising:
- generating a calibration excitation signal;
- conducting the calibration excitation signal to a signal path of the electronic circuit;
- simultaneously conducting an operating signal of the electronic circuit and the calibration excitation signal on the signal path to responsively generate a calibration error signal on the signal path;
- detecting the calibration error signal on the signal path;
- evaluating the detected calibration error signal; and
- adjusting a variable transfer function circuit element in the signal path in accordance with the evaluation of the detected calibration error signal so as to minimize the calibration error signal.

30. The method of claim 29, wherein generating the calibration excitation signal comprises generating one of a random calibration excitation signal, a pseudo-random calibration excitation signal, an out-of-band calibration excitation signal and a frequency spectrum shaped signal.

31. The method of claim 29, wherein generating the calibration excitation signal comprises a signal generator configured to shape the frequency spectrum of a clock signal.

32. The method of claim 29, wherein detecting a calibration error signal comprises detecting a calibration error signal synchronous with the calibration excitation signal.

33. A high voltage difference amplifier having an instrumentation amplifier with an inverting input coupled to a first external resistor, a noninverting input coupled to a second external resistor, wherein the first and second external resistors are unmatched external resistors, and an output, the high voltage difference amplifier circuit comprising:

at least one variable transfer function element coupled between a voltage reference node and at least one of the inverting input and the noninverting input of the instrumentation amplifier; and a calibration excitation signal generator coupled to the voltage reference node for transmitting a calibration excitation signal through the variable transfer function elements to the input of the instrumentation amplifier without interrupting normal operation of the high voltage difference amplifier circuit.

34. The high voltage difference amplifier circuit of claim 33, further comprising a synchronous error detection circuit coupled to the output of the instrumentation amplifier for detecting a calibration error signal.

35. The high voltage difference amplifier circuit of claim 33, further comprising calibration control circuitry coupled between the variable transfer function elements and the synchronous error detection circuit and configured to adjust the variable transfer function elements in response to an error detection signal from the synchronous error detection circuit.

* * * * *